United States Patent [19]

Fujii

[11] Patent Number: 5,519,578
[45] Date of Patent: May 21, 1996

[54] FOLDED PRINTED WIRING BOARD STRUCTURE WITH ELECTROMAGNETIC SHIELD

[75] Inventor: Masahiro Fujii, Tokyo, Japan

[73] Assignee: NEC Corporation, Japan

[21] Appl. No.: 254,781

[22] Filed: Jun. 6, 1994

[30] Foreign Application Priority Data

Jun. 17, 1993 [JP] Japan ................................ 5-145902
Dec. 28, 1993 [JP] Japan ................................ 5-335117

[51] Int. Cl.$^6$ .............................. H05K 1/14; H05K 9/00
[52] U.S. Cl. ..................... 361/749; 174/35 R; 174/51;
174/254; 361/751; 361/789; 361/803; 361/816;
361/818; 439/67; 439/77; 439/88; 439/607
[58] Field of Search ........................... 174/35 R, 35 MS,
174/35 TS, 51, 254, 255, 256, 257, 258,
259, 268; 361/749–751, 792–795, 816,
818, 789, 803; 257/659, 728, 723, 724;
439/67, 77, 88, 68, 607, 609, 485; 354/286

[56] References Cited

U.S. PATENT DOCUMENTS 4,858,071  8/1989  Manabe et al. ...................... 361/749

FOREIGN PATENT DOCUMENTS 1355837  2/1964  France .................................. 361/792
2427412  6/1974  Germany ............................... 174/254
2262729  7/1974  Germany ............................... 361/749
3-46387   2/1991  Japan .................................... 439/485
1088408  10/1967  United Kingdom ............... 174/35 MS

OTHER PUBLICATIONS

IBM Technical Disclosure Bulletin "Removal Of Heat From Direct Chip Attach Circuitry" vol. 32 No. 4A Sep. 1989.

*Primary Examiner*—Donald A. Sparks
*Attorney, Agent, or Firm*—Whitham, Curtis, Whitham & McGinn

[57] ABSTRACT

A printed wiring board structure includes a printed wiring board and an electromagnetic shielding member. The printed wiring board has a part-mounted surface formed on one surface thereof, a ground surface formed on a reverse surface side to the part-mounted surface, and an exploded shape including at least a portion constituted by a flexible printed wiring board, and bottom and upper surface portions which are divided from each other by the flexible printed wiring board. The printed wiring board is folded at a portion constituted by the flexible printed wiring board to cause the part-mounted surface to face inside and to make the bottom surface portion parallel to the upper surface portion, thereby constituting a stereoscopic structure having two wiring layers. The electromagnetic shielding member is parallelly arranged between opposing part-mounted surfaces of the bottom and upper surface portions of the printed wiring board in which the stereoscopic structure is constituted.

11 Claims, 3 Drawing Sheets

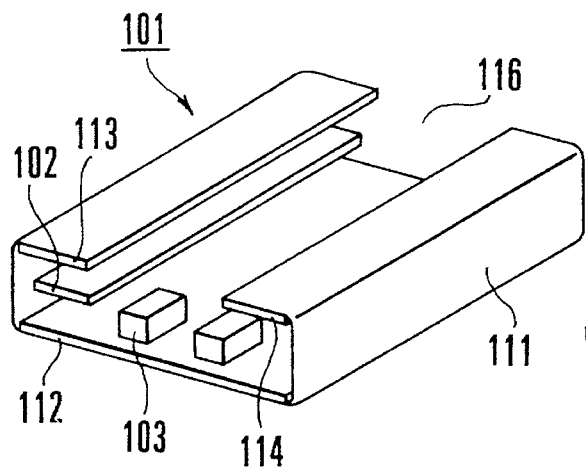
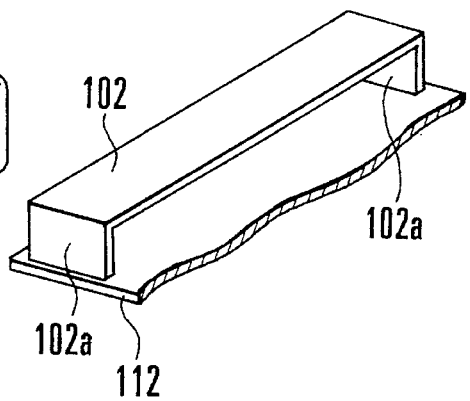
F I G. 1A  F I G. 1B
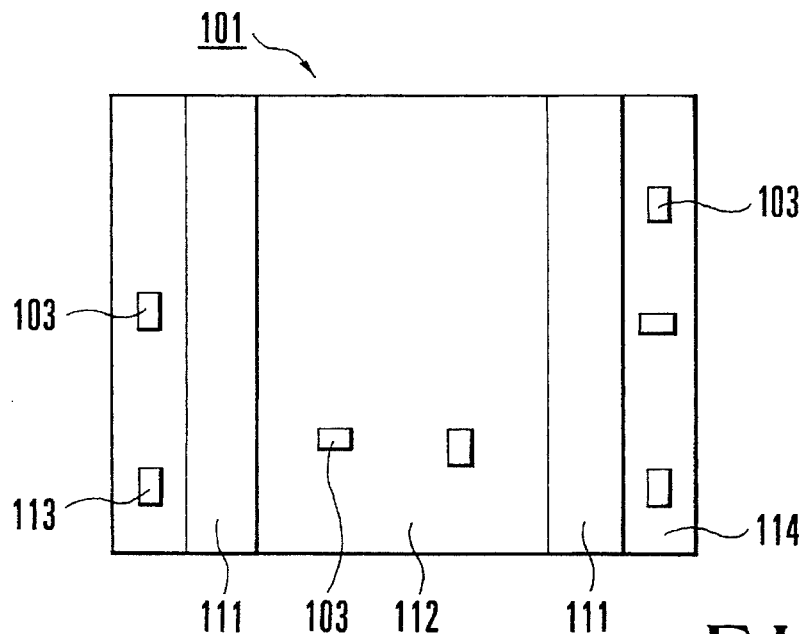
F I G. 2
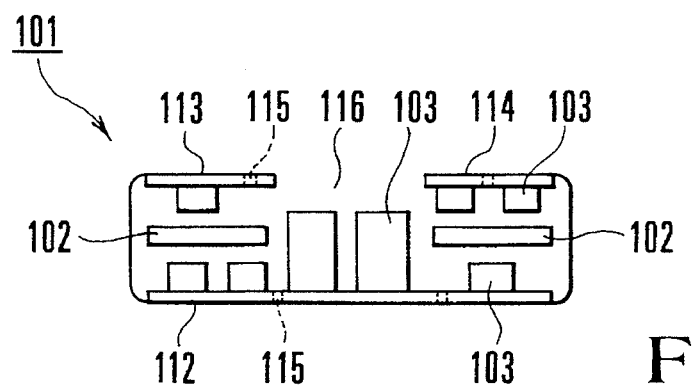
F I G. 3

5,519,578

FOLDED PRINTED WIRING BOARD STRUCTURE WITH ELECTROMAGNETIC SHIELD

BACKGROUND OF THE INVENTION

The present invention relates to a printed wiring board structure for an electronic device and, more particularly, to a printed wiring board structure for a transceiver unit using a flexible printed wiring board.

In a conventional printed wiring board structure for an electronic device, as shown in FIG. 8, a transmitter 5 and a receiver 6 are respectively arranged on two printed wiring boards 1a and 1b, and the printed wiring boards 1a and 1b are arranged such that their surfaces on which parts 3 are not mounted are in contact with each other. A shield case 7 is arranged around them to electrically shield the interior of the device from the external space.

In Japanese Utility Model Laid-Open No. 62-112171 (FIG. 4) and Japanese Patent Laid-Open No. 62-155585, the following example is shown and described. That is, a printed wiring board structure for an electronic device is partially constituted by a flexible printed wiring board, and is stereoscopically assembled to cause its part-mounted surface to face the inside.

However, in the conventional structure shown in FIG. 8, since the parts 3 on the printed wiring boards 1a and 1b have various heights, a space above the short parts 3 is wasted when the shield case 7 is arranged to constitute the stereoscopic structure. For this reason, the device disadvantageously increases in volume.

In addition, the shield case 7 is undesirably required to electrically shield the printed wiring boards 1a and 1b from the external space.

In the latter prior art in which the stereoscopic structure is constituted to cause the part-mounted surface to face inside, coupling disadvantageously occurs between the opposing part-mounted surfaces. This problem is conspicuous in a high-frequency device. This device cannot be constituted without solving the problem.

SUMMARY OF THE INVENTION

It is an object of the present invention to provide a printed wiring board structure in which a wasteful space is not formed above short electronic parts mounted on a printed wiring board.

It is another object of the present invention to provide a printed wiring board structure in which a printed wiring board is decreased in volume to miniaturize a device.

It is still another object of the present invention to provide a printed wiring board structure in which opposing electronic parts are prevented from being coupled to each other.

In order to achieve the above objects, according to the present invention, there is provided a printed wiring board structure comprising a printed wiring board having a part-mounted surface formed on one surface thereof, a ground surface formed on a reverse surface side to the part-mounted surface, and an exploded shape including at least a portion constituted by a flexible printed wiring board, and bottom and upper surface portions which are divided from each other by the flexible printed wiring board, the printed wiring board being folded at a portion constituted by the flexible printed wiring board to cause the part-mounted surface to face inside and to make the bottom surface portion parallel to the upper surface portion, thereby constituting a stereoscopic structure having two wiring layers, and an electromagnetic shielding member parallelly arranged between opposing part-mounted surfaces of the bottom and upper surface portions of the printed wiring board in which the stereoscopic structure is constituted.

BRIEF DESCRIPTION OF THE DRAWINGS

FIG. 1A is a perspective view of the first embodiment of a printed wiring board structure according to the present invention;

FIG. 1B is a perspective view showing an example of the electromagnetic shielding member shown in FIG. 1A;

FIG. 2 is an exploded view of the printed wiring board structure in FIG. 1A;

FIG. 3 is a side view of the printed wiring board structure in FIG. 1A;

DESCRIPTION OF THE PREFERRED EMBODIMENTS

Figure 4:
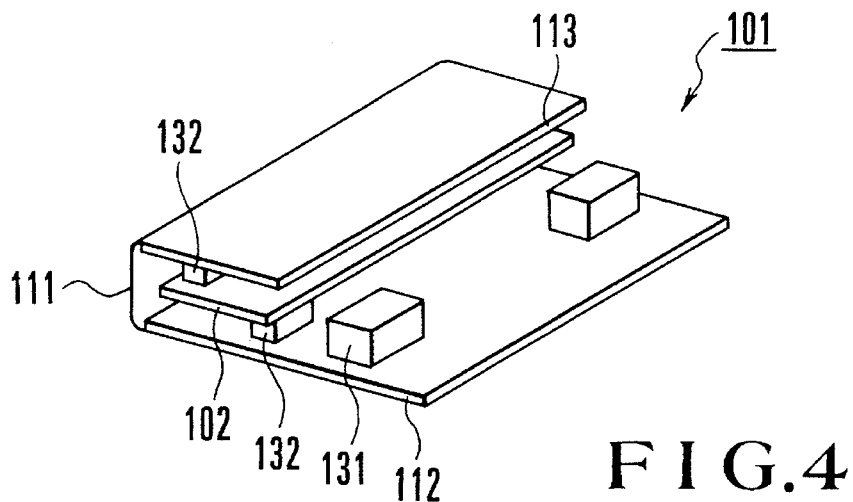
FIG. 4 is a perspective view of the second embodiment of a printed wiring board structure according to the present invention.

The present invention will be described below with reference to the accompanying drawings. FIG. 1A shows the first embodiment of a printed wiring board structure according to the present invention, FIG. 1B shows an example of the electromagnetic shielding member in FIG. 1A, and FIGS. 2 and 3 show the printed wiring board shown in FIG. 1A.

Referring to FIG. 2, a printed wiring board 101 has an exploded shape constituted by a rectangular flexible printed wiring board 111 having a size equal to that of the entire exploded shape of the printed wiring board 101, a rectangular hard printed wiring board 112 which overlaps and adheres to the flexible printed wiring board 111 at a position near the center of the flexible printed wiring board 111 with an adhesive, and a pair of elongated hard printed wiring boards 113 and 114 which respectively overlap and adhere both the end portions of the flexible printed wiring board 111 with an adhesive. The hard printed wiring board 112 constitutes the bottom surface portion of the printed wiring board 101 having a stereoscopic structure, and the hard printed wiring boards 113 and 114 constitute upper surface portions, respectively. A circuit pattern for mounting electronic circuit parts is formed on the surface of each of the hard printed wiring boards 112 to 114. Circuit patterns including wiring structures between the hard printed wiring board 112 and the hard printed wiring boards 113 and 114 are formed on the adhering surfaces of the flexible printed wiring board 111 to the hard printed wiring boards 112 to 114, and a ground pattern is formed on the almost entire non-adhering surface which is reverse to the adhering surface of the flexible printed wiring board. The circuit patterns of the hard printed wiring boards 112 to 114 are connected to connection portions (not shown) on the reverse surface of the flexible printed wiring board 111 via through holes 115, and are electrically connected to the circuit pattern, of the flexible printed wiring board 111, adhering to the flexible printed wiring board 111 through the connection portions. As the connection portions described above, plated portions, of the through holes, which are formed on the reverse surface of the flexible printed wiring board 111 may be used. In addition, each of the hard printed wiring boards 112 to 114 may be constituted by a double-sided printed wiring board on which a connection pattern is formed on a contact surface side between a corresponding one of the hard printed wiring boards and the flexible printed wiring board 111.

The printed wiring board 101 having the exploded shape described above will be assembled as follows. The flexible printed wiring board 111 is folded along the edges of the hard printed wiring boards 112 to 114 to cause the part-mounted surface mounted with electronic parts 103 to face inside and to make the hard printed wiring board 112 parallel to the hard printed wiring boards 113 and 114, thereby constituting a stereoscopic structure. More specifically, the printed wiring board 101 is assembled such that the flexible printed wiring board 111 is folded to make the part-mounted surface of the hard printed wiring board 112 parallel to the part-mounted surfaces of the hard printed wiring boards 113 and 114 and to cause the hard printed wiring board 112 to oppose the hard printed wiring boards 113 and 114. At this time, an opening 116 communicating with the part-mounted surface of the hard printed wiring board 112 is formed by the opposing end portions of the hard printed wiring boards 113 and 114.

Between the part-mounted surface formed by the hard printed wiring board 112 of the printed wiring board 101 and the part-mounted surfaces formed by the hard printed wiring boards 113 and 114 of the printed wiring board 101, as shown in FIG. 3, plate-like electromagnetic shielding members 102 are arranged through the electronic parts 103 arranged along the opposing part-mounted surfaces. Each electromagnetic shielding member 102 has folded portions 102a at both the end portions thereof as shown in FIG. 1B, the end faces of the folded portion 102a are fixed to the hard printed wiring board 112 and supported by the printed wiring board 101. Note that one of the electromagnetic shielding members 102 is not illustrated in FIG. 1A. An electrical shielding effect between the electronic parts 103 mounted on the part-mounted surface of the hard printed wiring board 112 and the electronic parts 103 mounted on the part-mounted surfaces of the hard printed wiring boards 113 and 114 is obtained by the electromagnetic shielding members 102. As the material of the electromagnetic shielding member 102, an electromagnetic absorbent, a conductive resin, or a metal plate can be used. In addition, since a ground surface constituted by a ground pattern is constituted on the non-adhering surface, of the flexible printed wiring board 111, to which the hard printed wiring boards 112 to 114 do not adhere, i.e., on the reverse surface side to the part-mounted surface of the printed wiring board 101, the electronic parts 103 mounted on the printed wiring board 101 are electrically shielded from the external space.

In the above embodiment, although the bottom surface portion and upper surface portions of the printed wiring board having the stereoscopic structure are constituted by the hard printed wiring boards 112 to 114 adhering to the flexible printed wiring board 111, the printed wiring board 101 having the stereoscopic structure may be constituted by only the flexible printed wiring board 111 without adhering the hard printed wiring boards 112 to 114 to the flexible printed wiring board 111. Moreover, when the electromagnetic shielding members 102 of the printed wiring board 101 consist of a soft electromagnetic absorbent or a conductive resin, an electrical shielding effect and a physical buffer effect can be obtained at once.

FIG. 4 shows the second embodiment of a printed wiring board structure according to the present invention. Referring to FIG. 4, unlike the printed wiring board structure shown in FIG. 1, a hard printed wiring board 114 is omitted, only a hard printed wiring board 113 is turned down on one side at a portion of a flexible printed wiring board 111. More specifically, tall electronic parts 131 are concentratedly mounted at a portion where a part-mounted surface formed by a hard printed wiring board 112 does not oppose the hard printed wiring board 113. On the other hand, short electronic parts 132 are mounted at the remaining portion of the part-mounted surface formed by the hard printed wiring board 112, i.e., at a portion, of the part-mount portion of the hard printed wiring board 112, opposing the hard printed wiring board 113, and are mounted on the part-mounted surface formed by the hard printed wiring board 113 constituting the upper surface portion of the printed wiring board 101. In this manner, the short electronic parts 132 are arranged back to back. An electromagnetic shielding member 102 is arranged between the short electronic parts 132 mounted on the hard printed wiring board 112 and the short electronic parts 132 mounted on the hard printed wiring board 113. According to this embodiment, since the short electronic parts 132 are reliably mounted on the part-mounted surface of the hard printed wiring board 113 which is turned down to constitute the upper surface portion of the printed wiring board 101 and on the part-mounted surface of the hard printed wiring board 112 opposing the hard printed wiring board 113, the printed wiring board 101 can be constituted in a two-layered structure, and the part-mounted surface can be increased in size.

Figure 5:
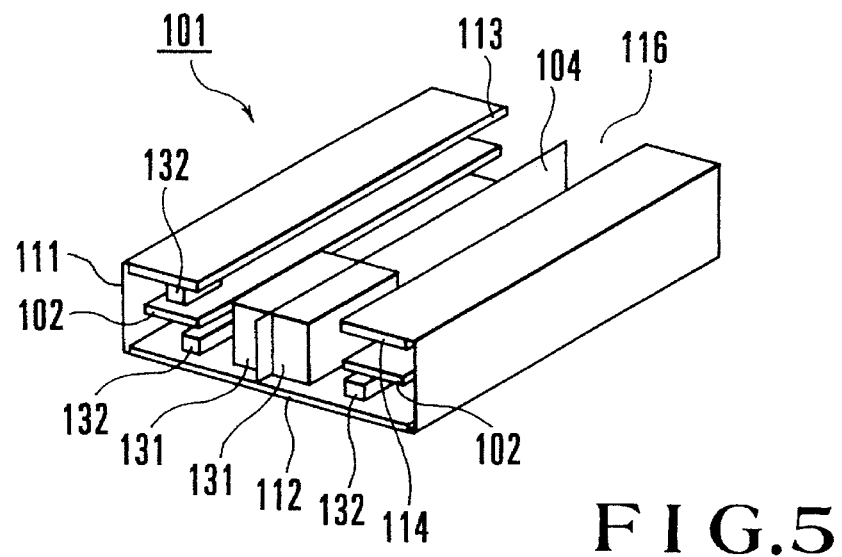
FIG. 5 is a perspective view of the third embodiment of a printed wiring board structure according to the present invention.
Figure 6:
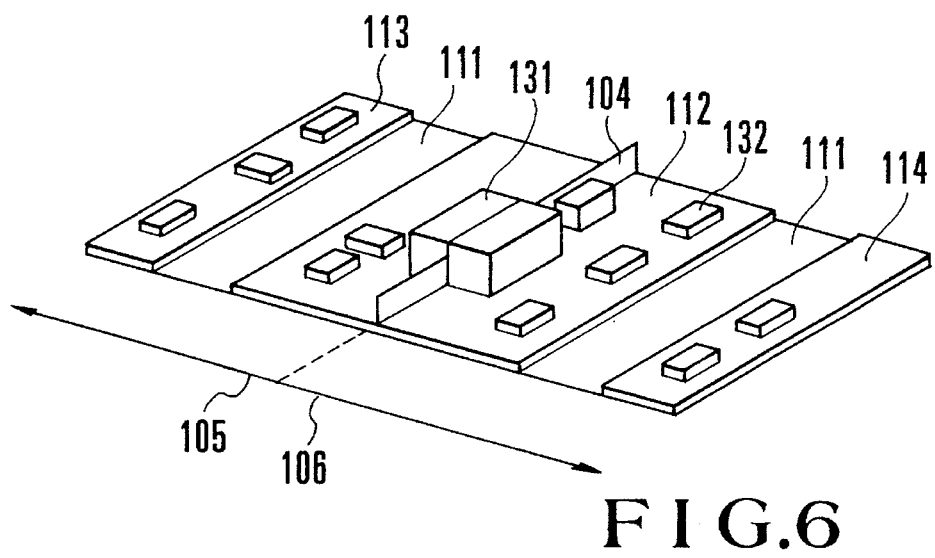
FIG. 6 is an exploded view of the printed wiring board structure in FIG. 5.

FIG. 5 shows the third embodiment of a printed wiring board structure according to the present invention, and FIG. 6 shows the printed wiring board structure in FIG. 5. The basic arrangement constituted by hard printed wiring boards 112 to 114 adhering to a flexible printed wiring board 111 is the same as that of FIG. 2. Referring to FIGS. 5 and 6, tall electronic parts 131 are concentratedly mounted at a central portion, of the hard printed wiring board 112 constituting the bottom surface portion of a printed wiring board 101, corresponding to an opening 116. On the other hand, short electronic parts 132 are mounted at both the end portions of the part-mounted surface formed by the hard printed wiring board 112, i.e., of the part-mounted surface opposing the hard printed wiring boards 113 and 114 constituting the upper surface portions of the printed wiring board 101, and are mounted on the part-mounted surfaces of the hard printed wiring boards 113 and 114 constituting the upper surface portions of the printed wiring board 101. The hard printed wiring boards 113 and 114 constituting the upper surface portions of the printed wiring board 101 are turned down at the portions of the flexible printed wiring board 111 along the edges of the hard printed wiring boards 112 to 114 from both the ends of the flexible printed wiring board 111 such that the hard printed wiring boards 113 and 114 are parallel to the hard printed wiring board 112, thereby constituting the printed wiring board 101 having a two-layered structure.

A shield plate 104 is arranged at the central portion of the part-mounted surface of the hard printed wiring board 112 constituting the bottom surface portion of the printed wiring board 101. A transmitter 105 is arranged in the area on one side of the shield plate 104, and a receiver 106 is arranged in the area on the other side, thereby constituting a transceiver. In addition, electromagnetic shielding members 102 are arranged between the short electronic parts 132 mounted on the part-mounted surface of the hard printed wiring board 112 and the short electronic parts 132 mounted on the part-mounted surfaces of the hard printed wiring boards 113 and 114.

Figure 7:
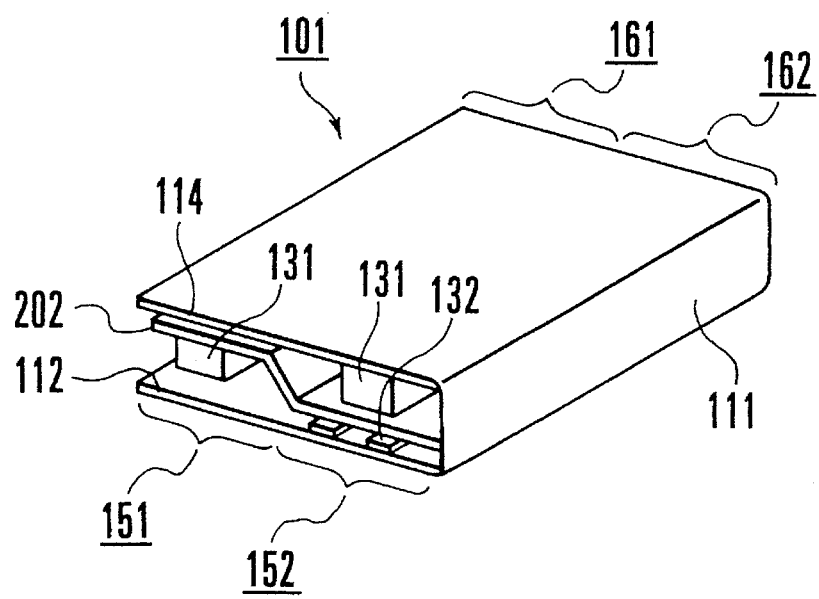
FIG. 7 is a perspective view of the fourth embodiment of a printed wiring board structure according to the present invention.
Figure 8:
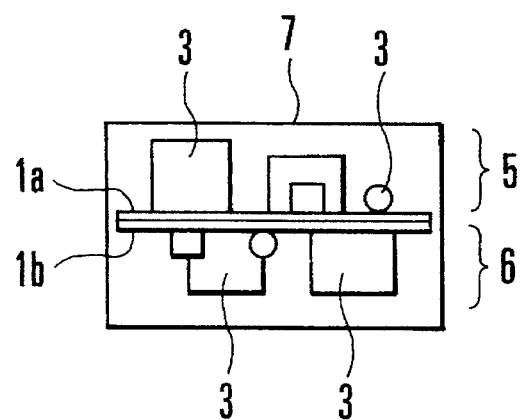
FIG. 8 is a side view of a conventional printed wiring board structure.

FIG. 7 shows the fourth embodiment of a printed wiring board structure according to the present invention. Referring to FIG. 7, as in FIG. 4, a hard printed wiring board 113 is omitted, a hard printed wiring board 114 constituting the upper surface portion of a printed wiring board 101 is turned down from one end side of a hard printed wiring board 112 constituting the bottom surface of the printed wiring board 101. More specifically, on the part-mounted surface of the hard printed wiring board 112 constituting the bottom surface portion of the printed wiring board 101, tall electronic parts 131 are mounted in one half area 151, and short electronic parts 132 are mounted in a remaining half area 152. In addition, on the part-mounted surface of the hard printed wiring board 114 constituting the upper surface portion of the printed wiring board 101, the tall electronic parts 131 are mounted in an area 162 opposing the area 152, and the short electronic parts 132 are mounted in an area 161 opposing the area 151. The hard printed wiring board 114 constituting the upper surface portion of the printed wiring board 101 is turned down at a portion of a flexible printed wiring board 111 such that the hard printed wiring board 114 is parallel to the hard printed wiring board 112 constituting the bottom surface portion of the printed wiring board 101, thereby constituting the printed wiring board 101 having a two-layered structure.

An electromagnetic shielding member 202 having a step at the boundary between the areas 151 and 161 and the areas 152 and 162 is arranged between the short electronic parts 132 mounted in the area 152 of the hard printed wiring board 112 and the tall electronic parts 131 mounted in the area 162 of the hard printed wiring board 114 and between the tall electronic parts 131 mounted in the area 151 of the hard printed wiring board 112 and the short electronic parts 132 mounted in the area 151 of the hard printed wiring board 112. In this embodiment, the part-mounted surfaces of the two-layered structure can be effectively used, and an electrical shielding effect between the electronic parts 131 and 132 mounted in the two-layered structure can be obtained.

Note that, in the second to fourth embodiments, when the electromagnetic shielding members 102 and 202 consist of a soft electromagnetic absorbent, a soft conductive resin, or a soft resin having a surface which is subjected to a conductive process, an electrical shielding effect and a physical buffer effect can be obtained at once.

In each of the first to fourth embodiments, although the hard printed wiring board 112 adheres to one side of the flexible printed wiring board 111, printed wiring layers may be formed on both the sides of the flexible printed wiring board 111 to constitute a multilayered printed wiring board.

As has been described above, in a printed wiring board structure according to the present invention, the part-mounted surfaces of printed wiring boards oppose to constitute a stereoscopic structure, and the printed wiring board is folded above only the portion at which short parts are mounted to constitute a two-layered structure. For this reason, a wasteful space decreases in volume, and the device can be decreased in volume.

Since an electromagnetic shielding member consisting of a soft electromagnetic absorbent or a soft conductive resin is arranged between opposing part-mounted surfaces of the printed wiring board, an electrical shielding effect between the printed wiring boards and a physical buffer effect can be obtained at once.

In addition, tall parts are mounted at the central portion of the printed wiring board, the short parts are mounted at both the end portions of the printed wiring board, and the printed wiring board is folded from both the sides thereof, thereby constituting a two-layered structure. For this reason, in the device, an area can be divided into two or more areas.

In addition, when a shield is arranged at the central portion of the areas of the printed wiring board, two or more areas of the device can be easily prevented from being coupled to each other.

The tall parts and short parts are selectively mounted, and a two-layered structure is constituted by folding the printed wiring board such that, on the opposing surfaces, the short parts are selectively mounted in an area opposing an area in which the tall parts are mounted, and the tall parts are selectively mounted in the area opposing the area in which the short parts are mounted. For this reason, the area of the device can be divided into two or more areas.

Moreover, since an electromagnetic shielding member is arranged between the opposing printed wiring boards, two or more areas of the device can be easily prevented from being coupled to each other.

Therefore, a transmitter is arranged in one area of the divided areas, and a receiver is arranged in the other area, thereby shielding the transmitter from the receiver. For this reason, a transceiver unit having preferable characteristics can be obtained.

What is claimed is:

1. A printed wiring board structure comprising:
   a printed wiring board having a part-mounted surface formed on one surface thereof, a ground surface formed on a reverse surface side to the part-mounted surface, and an exploded shape including at least a portion comprising a flexible printed wiring board, and hard bottom and upper surface portions which are divided from each other by said flexible printed wiring board, said printed wiring board being folded at said flexible printed wiring board to cause the part-mounted surface to face inside and to make said bottom surface portion parallel to said upper surface portion, thereby forming a stereoscopic structure having two wiring layers;
   an electromagnetic shielding member parallelly arranged between opposing part-mounted surfaces of said bottom and upper surface portions of said printed wiring board:
   a tall electronic part mounted in a central area of said bottom surface portion,
   a first short electronic part mounted at one end of said bottom surface portion; and
   a second short electronic part mounted on said upper surface portion of said printed wiring board,
   said upper surface portion being folded over said one end of said bottom surface portion of said printed wiring board over said first short electronic part,
   said electromagnetic shielding member comprising a plate-like member to electromagnetically shield said first short electronic part from said second short electronic part, said structure further comprising:
   a shield member arranged at a central portion of said bottom surface portion to divide the central area of said bottom surface portion of said printed wiring board into two areas, so that a first circuit unit is arranged in a first area and a second circuit unit is arranged in a second area.

2. A structure according to claim 1, wherein the central area is set at a position near a center of said bottom surface portion of said printed wiring board in a folding direction of said upper surface portion, the end area is set at a position near either end of said bottom surface portion of said printed wiring board, and said shield member is arranged to divide the central area in the folding direction of said upper surface portion, and wherein said upper surface portion of said printed wiring board is folded at both the ends of said bottom surface portion of said printed wiring board.

3. A structure according to claim 1, wherein said electromagnetic shielding member comprises a material selected from the group consisting of an electromagnetic absorbent, a conductive resin, and a metal plate.

4. A structure according to claim 1, wherein said electromagnetic shielding member is a buffer material.

5. A structure according to claim 1, wherein said printed wiring board comprises:

a first hard printed wiring board having a rectangular shape and adhering to said flexible printed wiring board to form said bottom surface portion of said printed wiring board, and elongated second and third hard printed wiring boards adhering to said flexible printed wiring board with predetermined intervals from both the ends of said first hard printed wiring board to form upper surface portions of said printed wiring board, said flexible printed wiring boards between said first, second, third hard printed wiring boards being folded to turn down said second and third hard printed wiring boards to oppose said first hard printed wiring board, thereby forming stereoscopic structure.

6. A structure according to claim 1, wherein said electromagnetic shielding member comprises a plate-like member and has a pair of folded portions which are folded downward at both ends of said electromagnetic shielding member, and ends of said folded portions are fixed and supported on said bottom surface portion of said printed wiring board.

7. A printed wiring board structure comprising:

a printed wiring board having a part-mounted surface formed on one surface thereof, a ground surface formed on a reverse surface side to the part-mounted surface, and an exploded shape including at least a portion comprising a flexible printed wiring board, and hard bottom and upper surface portions divided by said flexible printed wiring board, said printed wiring board being folded at said flexible printed wiring board to cause the part-mounted surface to face inside and to make said bottom surface portion parallel to said upper surface portion, thereby forming a stereoscopic structure having two wiring layers;

an electromagnetic shielding member parallelly arranged between opposing part-mounted surfaces of said bottom and upper surface portions of said printed wiring board, wherein a first tall electronic part is mounted in a first area of said bottom surface portion, a first short electronic part is mounted in a second area, a second short electronic part is mounted in a third area, and a second tall electronic part is mounted in a fourth area, and said upper surface portion of said printed wiring board is folded such that said third and fourth areas, of said upper surface portion of said printed wiring board oppose said first and second areas of said bottom surface portion said electromagnetic shielding member comprising a plate-like member having a step between said first and third areas and said second and fourth areas to electromagnetically shield said electronic parts mounted on the part-mounted surface of said bottom surface portion of said printed wiring board from said electronic parts mounted on the part-mounted surface of said upper surface portion of said printed wiring board.

8. A structure according to claim 7, wherein said electromagnetic shielding member comprises a pair of folded portions which are folded downward at both ends of said electromagnetic shielding member, and ends of said folded portions are fixed and supported on said bottom surface portion of said printed wiring board.

9. A structure according to claim 7, wherein said electromagnetic shielding member comprises one material selected from the group consisting of an electromagnetic absorbent, a conductive resin, and a metal plate.

10. A structure according to claim 7, wherein said electromagnetic shielding member comprises of a buffer material.

11. A structure according to claim 7, wherein a first circuit unit is arranged in said first and second areas, a second circuit unit is arranged in said third and fourth areas, and said first circuit unit and said second circuit unit are electromagnetically shielded by said electromagnetic shielding member.

\* \* \* \* \*